(12) United States Patent
Wei et al.

(10) Patent No.: US 12,264,393 B2
(45) Date of Patent: Apr. 1, 2025

(54) SEMICONDUCTOR PROCESSING APPARATUS AND MIXING INLET DEVICE

(71) Applicant: BEIJING NAURA MICROELECTRONICS EQUIPMENT CO., LTD., Beijing (CN)

(72) Inventors: Jingfeng Wei, Beijing (CN); Lei Zhu, Beijing (CN); Hong Ji, Beijing (CN); Keke Zhao, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/540,854

(22) Filed: Dec. 14, 2023

(65) Prior Publication Data
US 2024/0183032 A1  Jun. 6, 2024

Related U.S. Application Data

(63) Continuation of application No. PCT/CN2022/098565, filed on Jun. 14, 2022.

(30) Foreign Application Priority Data

Jun. 18, 2021 (CN) .......................... 202110679808.7

(51) Int. Cl.
*C23C 16/455* (2006.01)
(52) U.S. Cl.
CPC .. *C23C 16/45512* (2013.01); *C23C 16/45544* (2013.01); *C23C 16/45561* (2013.01)
(58) Field of Classification Search
CPC ........ C23C 16/45512; C23C 16/45544; C23C 16/45561; C23C 16/455
See application file for complete search history.

(56) References Cited

U.S. PATENT DOCUMENTS

| 6,068,703 A | 5/2000 | Chen et al. |
| 2003/0019428 A1 | 1/2003 | Ku et al. |

(Continued)

FOREIGN PATENT DOCUMENTS

| CN | 201772458 U | 3/2011 |
| CN | 106457168 A | 2/2017 |

(Continued)

OTHER PUBLICATIONS

The World Intellectual Property Organization (WIPO) International Search Report for PCT/CN2022/098565 Sep. 16, 2022 7 Pages (including translation).

*Primary Examiner* — Joseph A Miller, Jr.
(74) *Attorney, Agent, or Firm* — ANOVA LAW GROUP, PLLC (57) ABSTRACT

A mixing inlet device of semiconductor processing equipment is arranged at a top of a process chamber of the semiconductor processing equipment and configured to input a process gas into the process chamber. The mixing inlet device includes a cover assembly and a mixing inlet block. A bottom of the cover assembly covers the top of the process chamber. The mixing channel is arranged in the cover assembly. The mixing inlet block is arranged at a center position at a top of the cover assembly and includes a plurality of inlet channels and a first annular chamber. A top of the first annular chamber communicates with the plurality of inlet channels, and a bottom of the first annular chamber communicates with the mixing channel of the cover assembly.

14 Claims, 2 Drawing Sheets

(56) References Cited

U.S. PATENT DOCUMENTS

2015/0376784 A1* 12/2015 Wu .................. C23C 16/45544
                                                          118/733
2017/0372914 A1* 12/2017 Yamashita .......... H01J 37/3244

FOREIGN PATENT DOCUMENTS

| | | |
|---|---|---|
| CN | 207288885 U | 5/2018 |
| CN | 110917914 A | 3/2020 |
| CN | 112359344 A | 2/2021 |
| CN | 112795905 A | 5/2021 |
| CN | 113430502 A | 9/2021 |
| DE | 102014106523 A1 | 11/2015 |
| JP | H07211643 A | 8/1995 |
| JP | H0955374 A | 2/1997 |
| JP | H118200 A | 1/1999 |
| JP | 2013046002 A | 3/2013 |
| JP | 2015528060 A | 9/2015 |
| JP | 2017228726 A | 12/2017 |
| JP | 2018037508 A | 3/2018 |
| JP | 2019004141 A | 1/2019 |
| JP | 2019208016 A | 12/2019 |
| KR | 20200098739 A | 8/2020 |
| TW | 201705355 A | 2/2017 |
| TW | 202025351 A | 7/2020 |
| WO | 2020125468 A1 | 6/2020 |

\* cited by examiner

SEMICONDUCTOR PROCESSING APPARATUS AND MIXING INLET DEVICE

CROSS-REFERENCE TO RELATED APPLICATION

This application is a continuation of International Application No. PCT/CN2022/098565, filed on Jun. 14, 2022, which claims the priority of Chinese Patent Application No. 202110679808.7, filed on Jun. 18, 2021, the entire contents of all of which are incorporated herein by reference.

TECHNICAL FIELD

The present disclosure relates to the technical field of semiconductor manufacturing technologies and, more particularly, to semiconductor processing equipment and a mixing inlet device of the semiconductor processing equipment.

BACKGROUND

An Atomic Layer Deposition (ALD) process is an advanced thin film deposition process. With the reduction of line widths to 7 nm and 5 nm in semiconductor fabrication, the ALD process for thin film deposition becomes widely used, for example, in the deposition of thin films including Al2O3, HfO, HfZrO, TaN, TiN, TaO, and W, which are applicable in most integrated circuit (IC) fields, such as logic devices, dynamic random-access memory (DRAM), and 3D flash memory. The ALD process has advantages such as self-limiting periodic growth, high film quality, and excellent step coverage. However, the ALD has a slow growth rate and long process time, which can significantly impact apparatus throughput.

In the current ALD process apparatus, each of two process gases is introduced independently through a main pipeline and four branch pipelines. The tops of the four branch pipelines are connected to the main pipeline. The bottoms of the four branch pipelines are connected to a top of a circular chamber. The circular chamber then distributes the process gases to eight gas diffusers. Several lateral holes of the gas diffusers release the process gases to realize a reaction with a wafer. However, since the two process gases simply use the pipelines and the large annular chamber for merging, the two process gases cannot be effectively mixed. Thus, the gas mixing efficiency is low, and the gas mixing effectiveness is poor. Therefore, the concentration of the process gases reaching the surface of the wafer is not uniform, which causes poor uniformity of the thin film.

SUMMARY

One aspect of the present disclosure provides a mixing inlet device of semiconductor processing equipment. The mixing inlet device is arranged at a top of a process chamber of the semiconductor processing equipment and configured to input a process gas into the process chamber. The mixing inlet device includes a cover assembly and a mixing inlet block. A bottom of the cover assembly covers the top of the process chamber. The mixing channel is arranged in the cover assembly. The mixing inlet block is arranged at a center position at a top of the cover assembly and includes a plurality of inlet channels and a first annular chamber. A top of the first annular chamber communicates with the plurality of inlet channels, and a bottom of the first annular chamber communicates with the mixing channel of the cover assembly. The mixing channel is configured to mix the process gas in the mixing inlet block again and input the process gas into the process chamber. The plurality of inlet channels extend along a tangential direction of the first annular chamber. Outlet holes of the plurality of inlet channels are distributed evenly along a circumferential direction of the first annular chamber.

Another aspect of the present disclosure provides semiconductor processing equipment. The semiconductor processing equipment includes a process chamber and a mixing inlet device. The mixing inlet device is arranged at a top of a process chamber of the semiconductor processing equipment and configured to input a process gas into the process chamber. The mixing inlet device includes a cover assembly and a mixing inlet block. A bottom of the cover assembly covers the top of the process chamber. The mixing channel is arranged in the cover assembly. The mixing inlet block is arranged at a center position at a top of the cover assembly and includes a plurality of inlet channels and a first annular chamber. A top of the first annular chamber communicates with the plurality of inlet channels, and a bottom of the first annular chamber communicates with the mixing channel of the cover assembly. The mixing channel is configured to mix the process gas in the mixing inlet block again and input the process gas into the process chamber. The plurality of inlet channels extend along a tangential direction of the first annular chamber. Outlet holes of the plurality of inlet channels are distributed evenly along a circumferential direction of the first annular chamber.

DETAILED DESCRIPTION OF THE EMBODIMENTS

The present disclosure is described in detail. Embodiments of the present disclosure are shown in the accompanying drawings. Same or similar signs represent same or similar members or members having same or similar functions. In addition, if the description of the known technology is unnecessary for the feature of the present disclosure, the description of the known technology can be omitted. Embodiments described in the accompanying drawings are exemplary and are only used to describe the present disclosure but not limit the present disclosure.

Those skilled in the art can understand that, unless otherwise specified, all terms (including the technical terms and scientific terms) have the same meaning understood by those of ordinary skill in the art. The terms defined in the general-purpose dictionary can have the same meaning as the meaning in the context of the existing technology. Unless the terms are defined specifically, the terms do not tend to be understood ideally or formally.

The technical solutions of the present disclosure are described in detail below with embodiments of the present disclosure.

Figure 1:
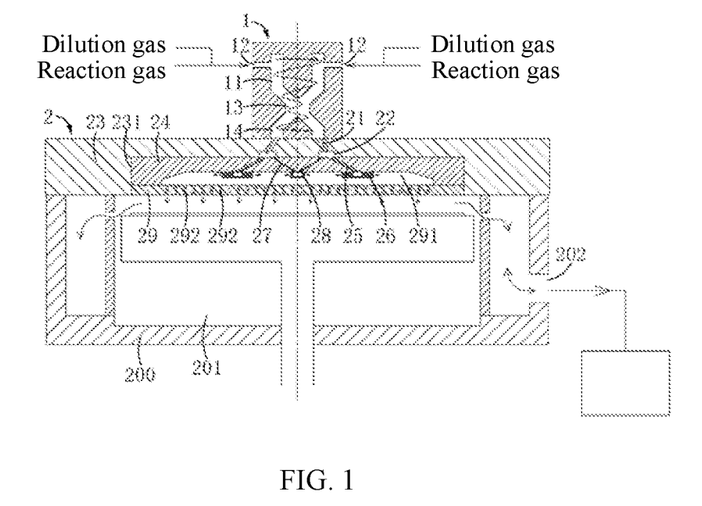
FIG. 1 is a schematic cross-section diagram showing cooperation between a mixing inlet device and a process chamber according to some embodiments of the present disclosure.
Figure 2:
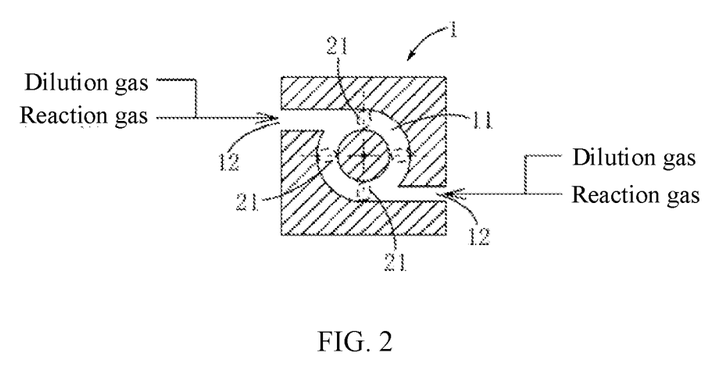
FIG. 2 is a schematic transverse section diagram of a mixing inlet block according to some embodiments of the present disclosure.

Embodiments of the present disclosure provide a mixing inlet device of semiconductor processing equipment. The mixing inlet device is arranged at a top of the semiconductor processing equipment and is configured to input process gases into a process chamber. As shown in FIG. 1 and FIG. 2, the mixing inlet device includes a mixing inlet block 1 and a cover assembly 2. The mixing inlet block 1 includes a first annular chamber 11 and a plurality of inlet channels 12. The top of the first annular chamber 11 communicates with the plurality of inlet channels 12. The bottom of the first annular chamber 11 communicates with the mixing channels of the cover assembly 2. The plurality of inlet channels 12 extend along a tangential direction of the first annular chamber 11. Outlets of the plurality of inlet channels 12 are distributed uniformly along a circumferential direction of the first annular chamber 11. The mixing inlet block 1 is arranged at an intermediate position at the top of the cover assembly 2. The bottom of the cover assembly 2 covers at the top of the process chamber 200. Mixing channels are arranged in the cover assembly 2 and configured to mix the process gases in the mixing inlet block 1 again and transfer the process gases after being homogenized into the process chamber 200.

As shown in FIG. 1 and FIG. 2, the semiconductor processing equipment is an Atomic Layer Deposition (ALD) apparatus configured to perform a titanium nitride (TiN) thin film deposition process, which is not limited in embodiments of the present disclosure. The mixing inlet block 1 can have a cylindrical structure and be arranged coaxially at the cover assembly 2. The first annular chamber 11 can be located in the mixing inlet block 1 and be coaxially arranged with the mixing inlet block 1. The top of the first annular chamber 11 communicates with two inlet channels 12. The bottom of the first annular chamber 11 communicates with the mixing channel of the cover assembly 2. The outlets of the two inlet channels 12 are arranged on two sides of the first annular chamber 11, communicate with the first annular chamber 11, and are uniformly distributed along the circumferential direction of the first annular chamber 11. The extension directions of the two inlet channels 12 are along the tangential direction of the first annular chamber 11. That is, the extension directions of the inlet channels 12 are arranged tangentially to the circumference of the first annular chamber 11. In some embodiments, the extension directions of the inlet channels 12 are parallel to the radial cross-section of the first annular chamber 11. The two inlet channels 12 can be configured to input two types of process gases. The two types of process gases can include a reaction gas and a dilution gas. The reaction gas can include, but is not limited to, for example, titanium tetrachloride and ammonia, and the dilution gas can include, but is not limited to, for example, nitrogen. The mixing inlet block 1 is arranged at the intermediate position (i.e., a position close to an axis or a coaxial position) of the top of the cover assembly 2. The mixing channels are arranged in the cover assembly 2. The bottom of the cover assembly 2 covers the top of the process chamber 200 to form a sealed reaction chamber 201 with the process chamber 200. The mixing channels of the cover assembly 2 can communicate with the first annular chamber 11 in the mixing inlet block 1 to mix the process gases in the mixing inlet block 1 again and input the process gases after being homogenized into the process chamber 200. After the process gases participate in performing the processes in the process chamber 200 (i.e., the reaction chamber 201), the process gases can be exhausted out of the process chamber 200 from an outlet opening 202 of the process chamber 200.

In embodiments of the present disclosure, the plurality of inlet channels can be arranged at the mixing inlet block. The plurality of inlet channels can extend along the tangential direction of the first annular chamber. The outlets of the plurality of inlet channels can be uniformly distributed along the circumferential direction of the first annular chamber to force the gas direction to be adjusted in the tangential direction after the plurality of process gases enter the first annular chamber from the plurality of corresponding inlet channels. Thus, the plurality of process gases can flow spirally in the first annular chamber to greatly improve the mixing uniformity of the process gases and effectively improve the concentration of the process gases reaching the surface of the wafer. Thus, the processing time can be effectively shortened, the film uniformity of the wafer can be greatly improved, and the productivity of the apparatus can be greatly increased.

In embodiments of the present disclosure, the implementation of the inlet channels 12 is not limited. For example, two or more inlet channels 12 can be supplied with different process gases, or more inlet channels 12 can be used to input the process gases including the reaction gas and the dilution gas. Embodiments of the present disclosure are not limited to this. Those skilled in the art can adjust the settings as needed.

In some embodiments, as shown in FIG. 1 and FIG. 2, the mixing inlet block 1 further includes a mixing chamber 13. An orthogonal projection of the mixing chamber 13 on a radial cross-section of the mixing inlet block 1 can be, for example, a circle. The mixing chamber 13 is arranged at the bottom of the first annular chamber 11 and is coaxially arranged with the first annular chamber 11. The radial size of the mixing chamber 13 can be smaller than the radial size of the outer annular wall of the first annular chamber. The first annular chamber 11 communicates with the mixing channels of the cover assembly 2 through the mixing chamber 13.

In some embodiments, as shown in FIG. 1 and FIG. 2, the mixing inlet block 1 further includes a mixing chamber 13. An orthogonal projection of the mixing chamber 13 on a radial cross-section of the mixing inlet block 1 can be, for example, a circle. The mixing chamber 13 is arranged at the bottom of the first annular chamber 11 and is coaxially arranged with the first annular chamber 11. The radial size of the mixing chamber 13 can be smaller than the radial size of the outer annular wall of the first annular chamber. In some embodiments, the radial size of the mixing chamber 13 can be the same as the radial size of the inner annular wall of the first annular chamber 11, which is not limited here. The bottom of the first annular chamber 11 communicates with the mixing chamber 13 to allow the first annular chamber 11 to communicate with the mixing channels of the cover assembly 2 through the mixing chamber 13. In some embodiments, the process gases of the two inlet channels 12 can be pre-mixed in the first annular chamber 11 and flow spirally into the mixing chamber 13. Since the radial size of the mixing chamber 13 is smaller than the radial size of the outer annular wall of the first annular chamber 11, the two process gases can be subject to forces of two directions including the tangential direction and the radial direction simultaneously to force the gas direction of the two types of the process gases to be adjusted. Thus, the mixing effectiveness of the process gases can be further improved, and the mixing uniformity and the mixing efficiency of the process gases can be greatly improved.

In some embodiments, as shown in FIG. 1 and FIG. 2, the mixing inlet block 1 further includes a second annular chamber 14. The second annular chamber 14 is arranged at the bottom of the mixing chamber 13 and is coaxially arranged with the mixing chamber 13. The radial size of the outer annular wall of the second annular chamber 14 can be greater than the radial size of the mixing chamber 13. The first annular chamber 11 can communicate with the mixing channels of the cover assembly 2 through the mixing chamber 13 and the second annular chamber 14 in sequence. That is, the first annular chamber 11 can communicate with the mixing chamber 13. The mixing chamber 13 can communicate with the mixing channels of the cover assembly 2 through the second annular chamber 14.

In some embodiments, as shown in FIG. 1 and FIG. 2, the mixing inlet block 1 further includes a second annular chamber 14. The second annular chamber 14 is arranged at the bottom of the mixing chamber 13 and is coaxially arranged with the mixing chamber 13. The radial size of the outer annular wall of the second annular chamber 14 can be greater than the radial size of the mixing chamber 13. In some embodiments, the second annular chamber 14 can have the same configuration as the first annular chamber 11. That is, the radial size of the outer annular wall of the second annular chamber 14 can be the same as the radial size of the outer annular wall of the first annular chamber 11, which is not limited here, as long as the radial size of the second annular chamber 14 is greater than the radial size of the mixing chamber 13. In some embodiments, when the two types of process gases are mixed in the mixing chamber 13, the flow rate of the mixing process gases can be slowed down with the above design. Thus, the process gases can be sufficiently mixed in the mixing chamber 13 with rapid mixing and homogenizing to further improve the mixing uniformity and the mixing efficiency.

In some embodiments of the present disclosure, as shown in FIG. 1 and FIG. 2, the radial size of the outer annular wall at the bottom of the first annular chamber 11 gradually decreases to communicate with the top of the mixing chamber 13. The radial size of the outer annular wall at the top of the second annular chamber 14 gradually decreases to communicate with the bottom of the mixing chamber 13.

As shown in FIG. 1 and FIG. 2, in the longitudinal sectional view of the mixing inlet block 1, the bottom two sides of the first annular chamber 11 narrow simultaneously. That is, the radial size at the bottom of the first annular chamber 11 gradually decreases to communicate with the top of the mixing chamber 13. That is, a transition annular chamber with a gradually decreasing radial size is arranged between the first annular chamber 11 and the mixing chamber 13 to cause the process gases in the first annular chamber 11 to converge into the mixing chamber 13 shown in FIG. 1. The top of the second annular chamber 14 can have the same structure as the bottom of the first annular chamber 11. The second annular chamber 14 and the first annular chamber 11 have opposite directions to communicate with the bottom of the mixing chamber 13. That is, a transitional annular chamber with a gradually increasing radial size is arranged between the second annular chamber 14 and the mixing chamber 13 to cause the process gases in the mixing chamber 13 to expand to the second annular chamber 14. With the design above, the mixing inlet block 1 can have a mixing inlet chamber in an "X" shape. The diameter of the mixing area can increase first and then decrease from the top to the bottom. Thus, the mixing uniformity and the mixing efficiency can be greatly improved. In some embodiments, the two types of process gases entering from the two inlet channels 12 can first flow downwardly along the first annular chamber 11 and form a spiral gas flow in the first annular chamber 11 in advance to initially mix the process gases in the two inlet channels 12. Then, when the process gases flow into the mixing chamber 13, the process gases can be forced to be adjusted in the tangential direction and the radial direction to continue to increase the mixing degree of the two types of process gases shown in the process gas flow of FIG. 1. Then, the process gases can enter the second annular chamber 14 to appropriately slow down the flow rate of the two types of process gases to mix the process gases sufficiently in the mixing chamber 13 with the rapid mixing and homogenizing. Thus, the mixing uniformity and the mixing efficiency can be further improved. Since many reaction gases used in the atomic layer deposition process have large molecular weights and high viscosity, the flow rate needs to be appropriately reduced to achieve better gas mixing. However, for the atomic layer deposition process, the process cycle needs to be short, and the gases need to be mixed rapidly. Thus, the above design can improve the applicability and application scope of embodiments of the present disclosure and the process efficiency.

In embodiments of the present disclosure, the structures at the connection between the first annular chamber 11 and the mixing chamber 13 and the connection between the second annular chamber 14 and the mixing chamber 13 are not limited, as long as the first annular chamber 11 and the second annular chamber 14 can communicate with the mixing chamber 13. Those of ordinary skill in the art can adjust as needed.

Figure 3:
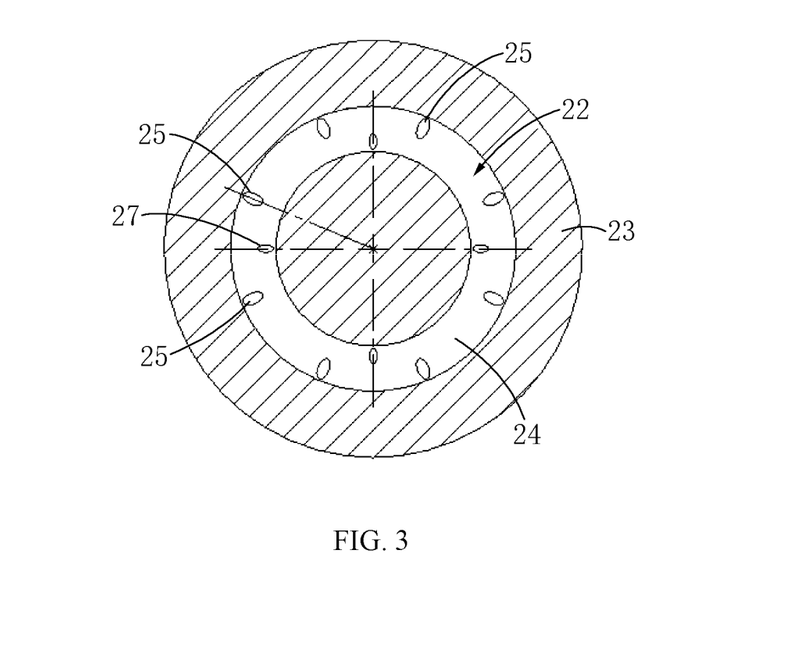
FIG. 3 is a schematic transverse section diagram of a third annular chamber according to some embodiments of the present disclosure.

In embodiments of the present disclosure, as shown in FIG. 1 and FIG. 3, the cover assembly 2 includes a cover 23 and a transfer plate 24. An accommodation groove 231 is formed at the bottom of the cover 23, and the transfer plate 24 is arranged in the accommodation groove 231. The mixing channels include a plurality of first gas-splitting channels 21, a plurality of second gas-splitting channels 25, and a third annular chamber 22. The top surface of the transfer plate 24 is attached to the bottom surface of the accommodation groove 231 and forms the third annular chamber 22 therebetween. In some embodiments, an annular groove can be formed at the bottom surface of the accommodation groove 231, and the top surface of the transfer plate 24 can cooperate with the annular groove to form the third annular chamber 22, which is not limited here. In some embodiments, the annular groove can also be formed at the top surface of the transfer plate 24. The bottom surface of the accommodation groove 231 can cooperate with the annular groove to form the third annular chamber 22. In some other embodiments, two annular grooves can be formed at the top surface of the transfer plate and the bottom surface of the accommodation groove 231 respectively. The two annular grooves can cooperate to form the third annular chamber 22. Those skilled in the art can make adjustments as needed.

The plurality of first gas-splitting channels 21 are arranged in the cover 23 and are evenly distributed along the circumferential direction. Two ends of each first gas-splitting channel 21 of the plurality of first gas-splitting channels 21 are connected to the second annular chamber 14 and the third annular chamber 22, respectively. The plurality of second gas-splitting channels 25 are arranged inside the transfer plate 24 and are evenly distributed along the circumferential direction. Two ends of each second gas-splitting channel 25 of the plurality of second gas-splitting channels 25 communicate with the third annular chamber 22 and the process chamber 200, respectively.

As shown in FIG. 1 and FIG. 3, the cover 23 has a circular plate-shaped structure. The circular accommodation groove 231 is formed at the bottom of the cover 23. The transfer plate 24 can also be a circular plate-shaped structure and be matched with the shape of the accommodation groove 231. The transfer plate 24 is arranged in the accommodation groove 231. The top surface of the transfer plate 24 is attached to the bottom surface of the accommodation groove 231. The annular groove can be formed on at least one of the bottom surface of the accommodation groove 231 and the top surface of the transfer plate 24 to form the third annular chamber 22 between the top surface of the transfer plate 24 and the bottom surface of the accommodation groove 231. With the above design, the structure of embodiments of the present disclosure can be simple, and the failure rate can be effectively reduced to greatly lower the application and maintenance cost. The plurality of first gas-splitting channels 21 are formed in the cover 23. For example, the quantity of the first gas-splitting channels 21 can be four, which is not limited here. For example, the quantity of the first gas-splitting channels 21 can be less than four or more than four. The two ends of the first gas-splitting channel 21 can be connected to the second annular chamber 14 and the third annular chamber 22, respectively. The plurality of first gas-splitting channels 21 can be evenly distributed along the circumferential direction of the second annular chamber 14 and the third annular chamber 22. In some embodiments, the mixing process gases of the second annular chamber 14 can be transferred into the third annular chamber 22 through the plurality of first gas-splitting channels 21 to be further mixed in the third annular chamber 22. Thus, the mixing uniformity of the process gases can be further improved to further improve the uniformity of the film deposition on the wafer. With the above design, the plurality of first gas-splitting channels 21 are evenly distributed. Thus, the mixing process gases in the second annular chamber 14 can be uniformly transferred into the third annular chamber 22 to further improve the mixing uniformity and the mixing efficiency. The second gas-splitting channels 25 can be arranged in the transfer plate 24 and can be evenly distributed along the circumferential direction. The quantity of the second gas-splitting channels 25 are not limited in embodiments of the present disclosure. For example, eight second gas-splitting channels 25 can be formed in the transfer plate 24. An end of each second gas-splitting channel 25 can communicate with the third annular chamber 22, and the other end of the second gas-splitting channel 25 can communicate with the bottom surface of the transfer plate 24. Thus, the third annular chamber 22 can communicate with the process chamber 200.

In some embodiments, as shown in FIG. 1 and FIG. 3, the cover assembly 2 also includes a plurality of first gas diffusers 26. The plurality of first gas diffusers 26 are arranged at the bottom surface of the transfer plate 24 and distributed in a ring shape. The plurality of first gas diffusers 26 are in a one-to-one correspondence with the plurality of second gas-splitting channels 25. The second gas-splitting channel 25 can communicate with the process chamber 200 through the corresponding first gas diffuser 26. In some embodiments, the cover assembly further includes eight first gas diffusers 26 arranged at the bottom surface of the transfer plate 24 and distributed in a ring shape around the axis of the transfer plate 24. The plurality of first gas diffusers 26 can communicate with the plurality of second gas-splitting channels 25. That is, the plurality of first diffusers 26 can be in a one-to-one correspondence with the plurality of second gas-splitting channels 25. The plurality of first diffusers 26 can be configured to homogenize the process gases in the third annular chamber 22. The process gases can be transferred into the reaction chamber 201 of the process chamber 200 through the second gas-splitting channels 25 and the first diffusers 26 in sequence. With the above design, since the plurality of first diffusers 26 are distributed in the ring shape, and the plurality of second gas-splitting channels 25 are distributed evenly, the mixing process gases can be sufficiently homogenized before entering the reaction chamber 201 of the process chamber 200.

In embodiments of the present disclosure, the quantity of the second gas-splitting channels 25 and the quantity of the first gas diffusers 26 are not limited, as long as the second gas-splitting channels 25 and the first gas diffusers 26 are in a one-to-one correspondence. The present disclosure is not limited to this, and those skilled in the art can adjust the setting as needed.

In embodiments of the present disclosure, as shown in FIG. 1 and FIG. 3, the cover assembly 2 further includes a second gas diffuser 28. The second gas diffuser 28 is at the center of the plurality of gas diffusers 26 distributed in the ring shape. The mixing channel further includes a plurality of third gas-splitting channels 27. The plurality of third gas-splitting channels 27 are arranged in the transfer plate 24 and are distributed evenly along the circumferential direction of the transfer plate 24. An end of each third gas-splitting channel 27 communicates with the third annular chamber 22. The other end of the third gas-splitting channel 27 communicates with the process chamber 200 through the second gas diffuser 28. In some embodiments, four third gas-splitting channels 27 are formed in the transfer plate 24. One second gas diffuser 28 can be arranged at the bottom surface (close to or at the center position) of the transfer plate 24. An end of each third gas-splitting channel 27 of the plurality of third gas-splitting channels 27 communicates with the third annular chamber 22 and is distributed evenly along the circumferential direction of the third annular chamber 22. The other end of the third gas-splitting channel 27 communicates with a second gas diffuser 28 and communicates with the process chamber 200 through the second gas diffuser 28. With the above design, since the second gas diffuser 28 is arranged at the center of the ring shape enclosed by the plurality of first gas diffusers 26, the uniformity of the mixing process gases can be further improved, especially the relative uniformity between the center area and the edge area.

In embodiments of the present disclosure, the quantity of the third gas-splitting channels (27) and the quantity of the second gas diffusers 28 are not limited, as long as the plurality of third gas-splitting channels 27 are appropriately arranged corresponding to the second gas diffusers 28. Thus, embodiments of the present disclosure are not limited to this. Those skilled in the art can adjust the setting as needed.

Figure 4:
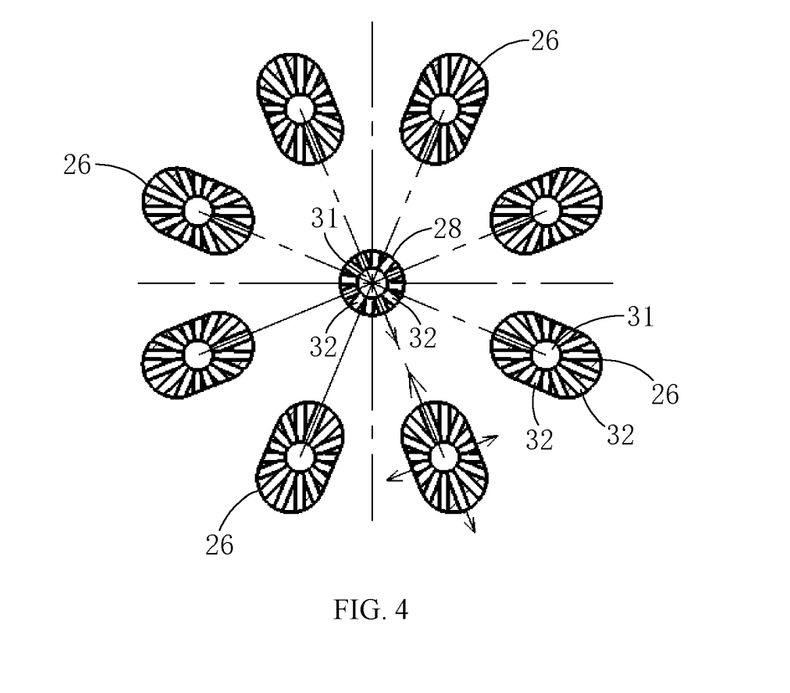
FIG. 4 is a schematic transverse section diagram showing cooperation between a first gas homogenizing sieve and a second gas diffuser according to some embodiments of the present disclosure.

In embodiments of the present disclosure, as shown in FIG. 1 and FIG. 4, the orthogonal projection of the first gas diffuser 26 on the radial cross-section of the transfer plate 24 is an oval. The orthogonal projection of the second gas diffuser 28 on the radial cross-section of the transfer plate 24 is a circle. A plurality of outlet channels 32 extending along different radial directions of the first gas diffusers 26 and the second gas diffusers 28 are arranged in the first gas diffusers 26 and the second gas diffusers 28.

As shown in FIG. 1 and FIG. 4, the first gas diffuser 26 can be in an oval shape. An inlet hole 31 is arranged on the top surface of the first gas diffuser 26 and is configured to communicate with the second gas-splitting channel 25. A plurality of outlet channels 32 extending along different radial directions (in horizontal directions) at the first gas diffuser 26. The plurality of outlet channels 32 can be evenly distributed and communicate with the inlet holes 31 of the first gas diffuser 26. The plurality of first gas diffusers 26 enclose to form a ring shape. Long axes of the plurality of first gas diffusers 26 extend along radial directions of the ring shape, and short axes of the plurality of first gas diffusers 26 extend along the circumferential direction of the ring shape to have a short path for the outlet channels 32 of the first gas diffusers 26 in the circumferential direction and a long path for the outlet channels 32 of the first gas diffusers 26 in the radial directions. The second gas diffuser 28 can have a circular block structure. The inlet hole 31 is arranged on the top surface of the second gas diffuser 28 and is configured to communicate with the third gas-splitting channel 27. A plurality of outlet channels 32 extending along different radial directions (in horizontal directions) of the second gas diffuser 28 at the second gas diffuser 28. The plurality of outlet channels 32 can be evenly distributed and communicate with the inlet hole 31 of the second gas diffuser 28. The plurality of outlet channels 32 of the second gas diffuser 28 can have a same length. the path of the outlet channel 32 of the first gas diffuser 26 in the radial direction of the ring shape can be long. Thus, the flow resistance of the mixing process gases can be a little larger to result in a slow gas release, which avoids a large collision force with the second gas diffuser 28 to greatly reduce the possibility of turbulence. The outlet channel 32 of the first gas diffuser 26 in the circumferential direction of the ring shape can be relatively shorter. Thus, the flow resistance of the mixing process gases can be a little smaller to result in a fast gas release. The paths of the outlet channels 32 of the second gas diffuser 28 can have the same length. With the above design, the outlet flow rate can be changed by changing the lengths of the paths of the outlet channels 32 in the radial direction and the circumferential direction of the first gas diffuser 26. In addition, with the flow collision at the second gas diffuser 28, the process gases can be well homogenized. That is, the concentration of the process gases can be distributed evenly to further improve the uniformity of the film deposited on the wafer.

In embodiments of the present disclosure, the structures of the first gas diffuser 26 and the second gas diffuser 28 are not limited, as long as the path length of the outlet channel 32 is satisfied. Embodiments of the present disclosure are not limited to this. Those skilled in the art can adjust the setting as needed.

In embodiments of the present disclosure, as shown in FIG. 1 and FIG. 3, the inlet hole of the second gas-splitting channel 25 is arranged at the position close to the outer edge of the third annular chamber 22. The inlet hole of the third gas-splitting channel 27 is arranged at the position close to the inner edge of the third annular chamber 22. The inlet holes of the plurality of second gas-splitting channels 25 and the inlet holes of the plurality of third gas-splitting channels 27 are arranged alternatively along the circumferential direction of the third annular chamber 22. In some embodiments, the inner diameter of the second gas-splitting channel 25 can be greater than the inner diameter of the third gas-splitting channel 27.

As shown in FIG. 1 and FIG. 3, the plurality of second gas-splitting channels 25 are arranged at the position close to the outer edge of the third annular chamber 22 to facilitate communication with the plurality of first gas diffusers 26 and shorten the distance between the plurality of second gas-splitting channels 25 and the plurality of first gas diffusers 26. The inlet holes of the third gas-splitting channels 27 are arranged at the position close to the inner edge of the third annular chamber 22 to facilitate the communication with the second gas diffuser 28 and shorten the distance between the third gas-splitting channel 27 and the second gas diffuser 28. The inlet holes of the second gas-splitting channels 25 and the third gas-splitting channels 27 are arranged alternatively at the circumferential direction of the third annular chamber 22. That is, an inlet hole of the third gas-splitting channel 27 can be arranged between two inlet holes of the second gas-splitting channels 25 to greatly improve the uniformity of the mixing process gases. Further, the diameter of the second gas-splitting channel 25 can be 6 to 12 mm, and the diameter of the third gas-splitting channel 27 can be 1 to 4 mm. That is, the inner diameter of the second gas-splitting channel 25 can be greater than the inner diameter of the third gas-splitting channel 27. Since each second gas-splitting channel 25 corresponds to one first gas diffuser 26, and the plurality of third gas-splitting channels 27 correspond to one second gas diffuser 28, the outlet amount of each gas diffuser can be further improved with the above design to further improve the uniformity of the outlet gas.

In embodiments of the present disclosure, as shown in FIG. 1 and FIG. 4, the radial size of the outer wall of the third annular chamber 22 is greater than the radial size of the outer wall of the second annular chamber 14. The outer ring radial size of the ring shape formed by the plurality of gas diffusers 26 can be greater than the radial size of the outer wall of the third annular chamber 22. The first gas-splitting channel 21, the second gas-splitting channel 25, and the third gas-splitting channel 27 are inclined straight channels. In some embodiments, the radial size of the outer wall of the third annular chamber 22 can be greater than the radial size of the outer wall of the second annular chamber 14. The outer ring radial size of the ring shape enclosed by the plurality of first gas diffusers 26 can be greater than the radial size of the outer wall of the third annular chamber 22. With such design, the structure of embodiments of the present disclosure can be simple, and the process gases can be quickly expanded to the size corresponding to the wafer to further improve the mixing uniformity and the mixing efficiency. Further, with the above design, the plurality of first gas-splitting channels 21 and the second gas-splitting channels 25 are inclined straight channels inclined outside from the top to the bottom to facilitate communication with the third annular chamber 22 and the plurality of first gas diffusers 26. Moreover, the plurality of third gas-splitting channels 27 are inclined straight channels inclined inside from the top to the bottom to facilitate communication with the second gas diffuser 28. With the above design, the process gases can reach the gas diffusers with the shortest paths. In addition, with the outlet channels 32 in the radial directions of the gas diffusers, the mixing process gases can be further quickly mixed to improve the mixing uniformity and the mixing efficiency.

In embodiments of the present disclosure, as shown in FIG. 1, the cover assembly 2 further includes a homogenizing plate 29. The homogenizing plate 29 is also arranged in the accommodation groove 231 and is flush with the bottom surface of the cover 23. A concave groove is formed at the bottom surface of the transfer plate 24. The top surface of the homogenizing plate 29 is enclosed with the concave groove to form a homogenizing space 291. A plurality of homogenizing holes 292 passing through the homogenizing plate 29 are formed in the perpendicular direction to the homogenizing plate 29. The homogenizing space 291 communicates with the reaction chamber 201 of the process chamber 200 through the plurality of homogenizing holes 292. In some embodiments, the mixing process gases output by the plurality of gas diffusers can be further mixed in the homogenizing space 291, and the mixing process gases can be then transferred vertically and uniformly to the surface of the wafer through the homogenizing holes 292 of the homogenizing plate 29 to further improve the mixing uniformity to further improve the uniformity of the film deposition of the wafer.

In embodiments of the present disclosure, the implementation of homogenizing space 291 is not limited. For example, the homogenizing plate 29 can be spaced apart from the transfer plate 24 to form the homogenizing space 291. Embodiments of the present disclosure are not limited to this. Those skilled in the art can adjust the setting as needed.

In embodiments of the present disclosure, the outlet holes of the plurality of inlet channels 12 can be at different positions in the axial direction of the first annular chamber 11. In some embodiments, the outlet holes of the plurality of inlet channels 12 can have different heights along the axial direction of the first annular chamber 11. For example, the outlet holes of the inlet channels 12 on the left side can be relatively higher, while the outlet holes of the inlet channels 12 on the right side can be relatively lower. Thus, the rotation speed of the process gases in the first annular chamber 11 can be further improved to further improve the mixing uniformity and the mixing efficiency. However, embodiments of the present disclosure are not limited to this. Those skilled in the art can adjust as needed.

Based on the same concept, embodiments of the present disclosure also provide semiconductor processing equipment, including the process chamber and the mixing inlet device.

In embodiments of the present disclosure, the following beneficial effects can be included.

In embodiments of the present disclosure, by arranging the plurality of inlet channels at the mixing inlet block, the plurality of inlet channels extend along the tangential direction of the first annular chamber. The outlet holes of the plurality of inlet channels can be distributed evenly along the circumferential direction of the first annular chamber to force the flow direction of the plurality of process gases after entering the first annular chamber from the plurality of corresponding inlet channels to be adjusted. Thus, the plurality of process gases can flow spirally in the first annular chamber to greatly improve the mixing uniformity of the process gases and improve the distribution uniformity of the concentration of the process gases reaching the surface of the wafer. Thus, the processing time can be effectively shortened, the uniformity of the film deposition of the wafer can be greatly improved, and the productivity of the apparatus can be greatly improved.

The above are merely exemplary embodiments of the present disclosure. The present disclosure is not limited to this. For those of ordinary skill in the art, modifications and improvements can be made without departing from the spirit and essence. The modifications and improvements are within the scope of the present disclosure.

In the present disclosure, the orientation or position relationships indicated by the terms "center," "upper," "lower," "front," "back," "left," "right," "vertical," and "horizontal" are based on the orientation or position relationship shown in the accompanying drawings. The terms are merely used to facilitate the description of the present disclosure and simplify the description and are not intended to indicate or imply that the devices or elements must have specific orientations, be constructed and operated with the specific orientation, and are not used to limit the present disclosure.

The terms "first" and "second" are used for descriptive purposes only and shall not be understood as indicating or implying relative importance or implicitly indicating the quantity of indicated technical features. Therefore, features defined as "first" and "second" can explicitly or implicitly include one or more of these features. In the description of the present disclosure, unless otherwise specified, "a plurality of" means two or more.

In the description of the present disclosure, unless otherwise clearly stated and limited, the terms "installation," "connection," and "coupled" should be understood in a broad sense. For example, the terms can mean a fixed connection, a detachable connection, or an integral connection. The terms can also mean a direct connection, a connection through an intermediate medium, or an internal communication of two elements. For those of ordinary skill in the art, the specific meanings of the above terms in the present disclosure can be understood according to the actual situation.

In the specification, specific features, structures, materials, or characteristics can be combined in any one or more embodiments or examples in a suitable manner.

The above are only some embodiments of the present disclosure. Those of ordinary skill in the art can make improvements and modifications without departing from the principles of the present disclosure. The improvements and modifications should be within the scope of the present disclosure.

What is claimed is:

1. A mixing inlet device, arranged at a top of a process chamber of a semiconductor processing apparatus and configured to input a process gas into the process chamber, comprising:
    a cover assembly, a bottom of the cover assembly covering the top of the process chamber, including:
        a mixing channel arranged in the cover assembly; and
        a mixing inlet block arranged at a center position at a top of the cover assembly and including:
            a plurality of inlet channels;
            a first annular chamber, a top of the first annular chamber communicating with the plurality of inlet channels; and
            a mixing chamber arranged at the bottom of the first annular chamber and coaxially with the first annular chamber;
    wherein:
        the mixing channel is configured to mix the process gas in the mixing inlet block again and input the process gas into the process chamber;
        the plurality of inlet channels extend along a tangential direction of a circumference of the first annular chamber; and
        outlet holes of the plurality of inlet channels are distributed evenly along a circumferential direction of the first annular chamber.

2. The device according to claim 1, wherein:
    a radial size of the mixing chamber being smaller than a radial size of an outer wall of the first annular chamber, and the first annular chamber communicating with the mixing channel in the cover assembly through the mixing chamber.

3. The device according to claim 2, wherein the mixing inlet block further includes:

a second annular chamber arranged at a bottom of the mixing chamber and coaxially with the mixing chamber, a radial size of an outer wall of the second annular chamber being greater than the radial size of the mixing chamber, the first annular chamber communicating with the mixing chamber, and the mixing chamber communicating with the mixing channel in the cover assembly through the second annular chamber.

4. The device according to claim 3, wherein:
the radial size of the outer wall at the bottom of the first annular chamber gradually decreases to communicate with the top of the mixing chamber; and
the radial size of the outer wall at a top of the second annular chamber gradually decreases to communicate with the bottom of the mixing chamber.

5. The device according to claim 1, wherein the cover assembly includes:
a cover including an accommodation groove at a bottom surface of the cover; and
a transfer plate arranged in the accommodation groove, the mixing channel including a plurality of first gas-splitting channels, a plurality of second gas-splitting channels, and a third annular chamber;
wherein:
a top surface of the transfer plate is attached to a bottom surface of the accommodation groove, an annular groove is formed at the bottom surface of the accommodation groove, and the third annular chamber is formed between the top surface of the transfer plate and the bottom surface of the accommodation groove;
the plurality of first gas-splitting channels are arranged in the cover and evenly distributed along a circumferential direction of the cover, and two ends of each first gas- splitting channel of the plurality of first gas-splitting channels communicate with the third annular chamber and the mixing inlet block, respectively; and
the plurality of second splitting channels are arranged in the transfer plate and distributed evenly along a circumferential direction of the transfer plate, and two ends of each second gas-splitting channel communicate with the third annular chamber and the process chamber, respectively.

6. The device according to claim 5, wherein the cover assembly further includes:
a plurality of first gas diffusers arranged at the bottom surface of the transfer plate and distributed in a ring shape and corresponding one-to-one with the plurality of second gas-splitting channels, the plurality of the second gas slitting channels communicating with the process chamber through the plurality of corresponding first gas diffusers.

7. The device according to claim 6, wherein:
the cover assembly further includes:
a second gas diffuser arranged at a center of a ring shape in which the plurality of gas diffusers are distributed; and
the mixing channel further includes:
a plurality of third gas-splitting channels arranged in the transfer plate and evenly distributed along a circumferential direction of the transfer plate, an end of each third gas-splitting channel of the plurality of third gas-splitting channels communicating with the third annular chamber, and the other end of the third gas-splitting channel communicating with the process chamber through the second gas diffuser.

8. The device according to claim 7, wherein:
an orthogonal projection of the first gas diffuser on a radial cross-section of the transfer plate is an oval;
an orthogonal projection of the second gas differs on the radial cross-section of the transfer plate is a circle; and
a plurality of outlet channels extending in different radial directions of the first gas diffuser and the second gas diffuser are formed in the first gas diffuser and the second gas diffuser.

9. The device according to claim 7, wherein:
an inlet hole of the second gas-splitting channel is arranged at a position close to an outer edge of the third annular chamber;
an inlet hole of the third gas-splitting channel is arranged at a position close to an inner edge of the third annular chamber; and
inlet holes of the plurality of second gas-splitting channels and inlet holes of the plurality of third gas-splitting channels are arranged alternatively along a circumferential direction of the third annular chamber.

10. The device according to claim 7, wherein an inner diameter of the second gas-splitting channel is larger than an inner diameter of the third gas-splitting channel.

11. The device according to claim 7, wherein:
a radial size of an outer wall of the third annular chamber is greater than the radial size of the outer wall of the second annular chamber;
an outer ring radial size of the ring shape formed by the plurality of first diffusers is greater than the radial size of the outer wall of the third annular chamber; and
the first gas-splitting channel, the second gas-splitting channel, and the third gas-splitting channel are inclined straight channels.

12. The device according to claim 7, wherein the cover assembly further includes:
a homogenizing plate arranged in the accommodation groove, the homogenizing plate forming a homogenizing space with the transfer plate, the first diffuser and the second diffuser being in the homogenizing space, a plurality of homogenizing holes being formed passing through the homogenizing plate, and the homogenizing space communicating with the process chamber through the plurality of homogenizing holes.

13. The device according to claim 1, wherein outlet holes of the plurality of inlet channels are at different positions along an axial direction of the first annular chamber.

14. A semiconductor processing apparatus, comprising:
a process chamber; and
a mixing inlet device arranged at a top of the process chamber of the semiconductor processing apparatus and configured to input a process gas into the process chamber, including:
a cover assembly, a bottom of the cover assembly covering the top of the process chamber, including:
a mixing channel arranged in the cover assembly; and
a mixing inlet block arranged at a center position at a top of the cover assembly and including:
a plurality of inlet channels; and
a first annular chamber, a top of the first annular chamber communicating with the plurality of inlet channels; and
a mixing chamber arranged at the bottom of the first annular chamber and coaxially with the first annular chamber;
wherein:

the mixing channel is configured to mix the process gas in the mixing inlet block again and input the process gas into the process chamber;

the plurality of inlet channels extend along a tangential direction of a circumference of the first annular chamber; and outlet holes of the plurality of inlet channels are distributed evenly along a circumferential direction of the first annular chamber.

* * * * *